(12) United States Patent
Hau-Riege

(10) Patent No.: US 7,087,516 B2
(45) Date of Patent: Aug. 8, 2006

(54) ELECTROMIGRATION-RELIABILITY IMPROVEMENT OF DUAL DAMASCENE INTERCONNECTS

(75) Inventor: Stefan P. Hau-Riege, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/681,522

(22) Filed: Oct. 7, 2003

(65) Prior Publication Data

US 2004/0067638 A1 Apr. 8, 2004

Related U.S. Application Data

(62) Division of application No. 10/010,679, filed on Nov. 13, 2001, now Pat. No. 6,717,268.

(51) Int. Cl.
*H01L 21/4763* (2006.01)

(52) U.S. Cl. .................. 438/622; 438/629; 438/666

(58) Field of Classification Search ......... 438/618–687
See application file for complete search history.

(56) References Cited

U.S. PATENT DOCUMENTS

| 5,629,236 A | 5/1997 | Wada et al. |
| 6,124,198 A | 9/2000 | Moslehi |
| 6,242,808 B1 * | 6/2001 | Shimizu et al. ............. 257/762 |
| 6,281,586 B1 | 8/2001 | Feurle et al. |
| 6,307,268 B1 | 10/2001 | Lin |

OTHER PUBLICATIONS

Hau-Riege, S.P., et al., Experimental Studies of the Reliability of Interconnect Trees, MRS Symposium Proceedings, 612,D10.2.1 (2000), 6 pages.

* cited by examiner

*Primary Examiner*—H. Jey Tsai
(74) *Attorney, Agent, or Firm*—Blakely, Sokoloff, Taylor & Zafman LLP

(57) ABSTRACT

Metallic reservoirs in the form of passive or dummy vias are used on interconnects as a source or sink for electromigration material, slowing the build up of electromigration-induced mechanical stress. The passive or dummy vias are disposed in a vertical direction from the interconnect (perpendicular to the plane of the interconnect) to so that the reservoirs do not occupy additional space in the interconnect layer. Both apparatus and method embodiments are described.

3 Claims, 4 Drawing Sheets

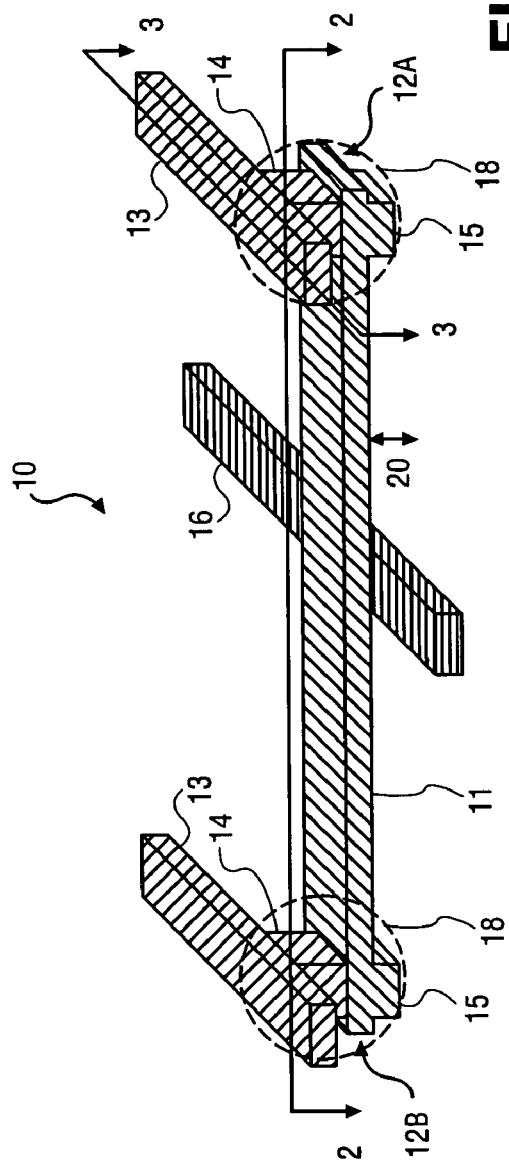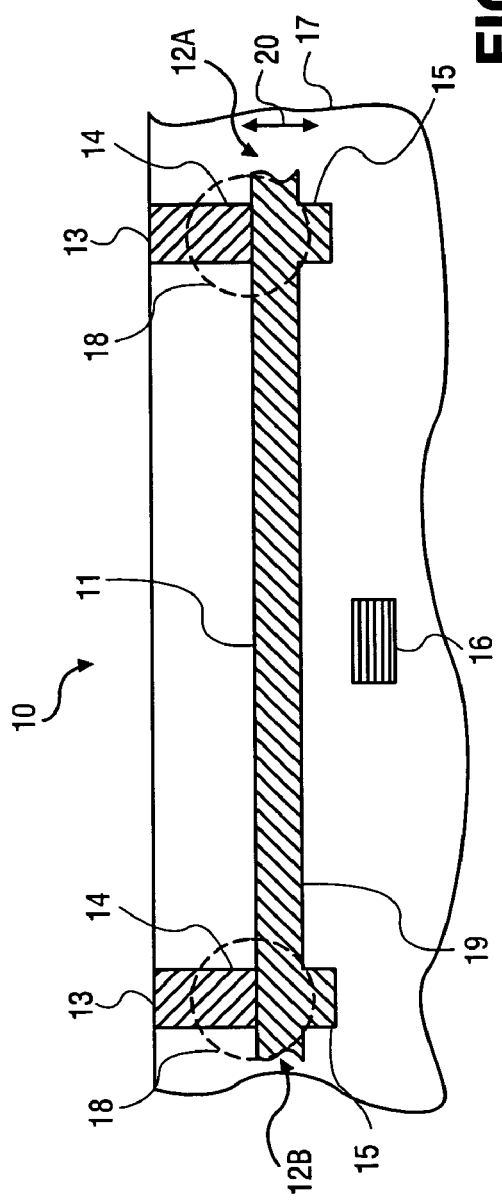

ELECTROMIGRATION-RELIABILITY IMPROVEMENT OF DUAL DAMASCENE INTERCONNECTS

The present patent application is a divisional of Application No.: 10/010,679 filed Nov. 13, 2001, now U.S. Pat. No. 6,717,268.

BACKGROUND OF THE INVENTION

1. Field of the Invention

The present invention relates to integrated circuit (IC) manufacture and more particularly to an apparatus and method for improving electromigration reliability of dual damascene interconnects through the introduction of material reservoirs in the form of dummy via plugs.

2. Description of Related Art

Modern integrated circuits use electrically conductive interconnections to connect the individual devices on a chip or to send and receive signals external to the chip. Common types of interconnections include aluminum (Al) alloy interconnection lines and copper (Cu) interconnection lines coupled to individual devices, including other interconnection lines, by interconnections through vias. In order to enhance interconnect speed and reliability, the semiconductor manufacture industry is moving away from blanket deposition and etch of Al-based metallizations towards single damascene and dual damascene interconnect structures with Cu-based metallizations.

A major reliability concern in today's integrated circuits is failure of metallic interconnects mainly due to electromigration. Typically, an interconnect system is connected through via plugs to other metal layers or to silicon. Studies have shown that via plugs are places of atomic flux divergence, making them a primary electromigration reliability concern. Electromigration imposes limits on the maximum allowed currents in interconnects. Electromigration is electric current-induced metal self-diffusion, where in places in which atoms are depleting a more tensile stress develops, while in places where atoms are accumulating a more compressive stress develops. If tensile stresses become too large, voiding occurs. Subsequent metal void growth under continued electromigration during normal microprocessor operation would generally lead to interconnect failure. Similarly, if compressive stresses become too large, metallic extrusions can form which can lead to short circuit of the integrated circuit (IC) device.

BRIEF DESCRIPTION OF THE DRAWINGS

The present invention is illustrated by way of example and not limitation in the accompanying figures:

FIG. 1 is a three-dimensional (3-D) schematic view of an IC interconnect structure having dummy via plugs which are electrically inactive according to one embodiment of the invention.

FIG. 2 is a cross-sectional view of IC interconnect structure of FIG. 1, according to one embodiment of the invention.

DETAILED DESCRIPTION OF THE INVENTION

An improvement in the electromigration reliability of damascene interconnects through the addition of material reservoirs in the form of passive or dummy via plugs introduced in the vertical plane of metallic interconnect structures is described. Passive or dummy via plugs formed in metallic interconnects are electrically inactive; that is, the vias are arranged/configured such that each does not contact two or more metallic interconnects to conduct electrical current between the metal interconnects. Dummy via plugs formed in the metallic interconnects act as reservoirs for metallic ions and reduce mechanical stress built up by electromigration, thus improving the reliability of interconnects.

In the following detailed description, numerous specific details are set forth, such as specific materials, structures, processes, etc., in order to provide a more thorough understanding of the present invention. However, it will be apparent to those skilled in the art to which this invention pertains that the present invention may be practiced without these specific details. In other instances, well-known devices, methods, procedures, and individual components have not been described in detail so as not to unnecessarily obscure aspects of the present invention.

Figure 3:
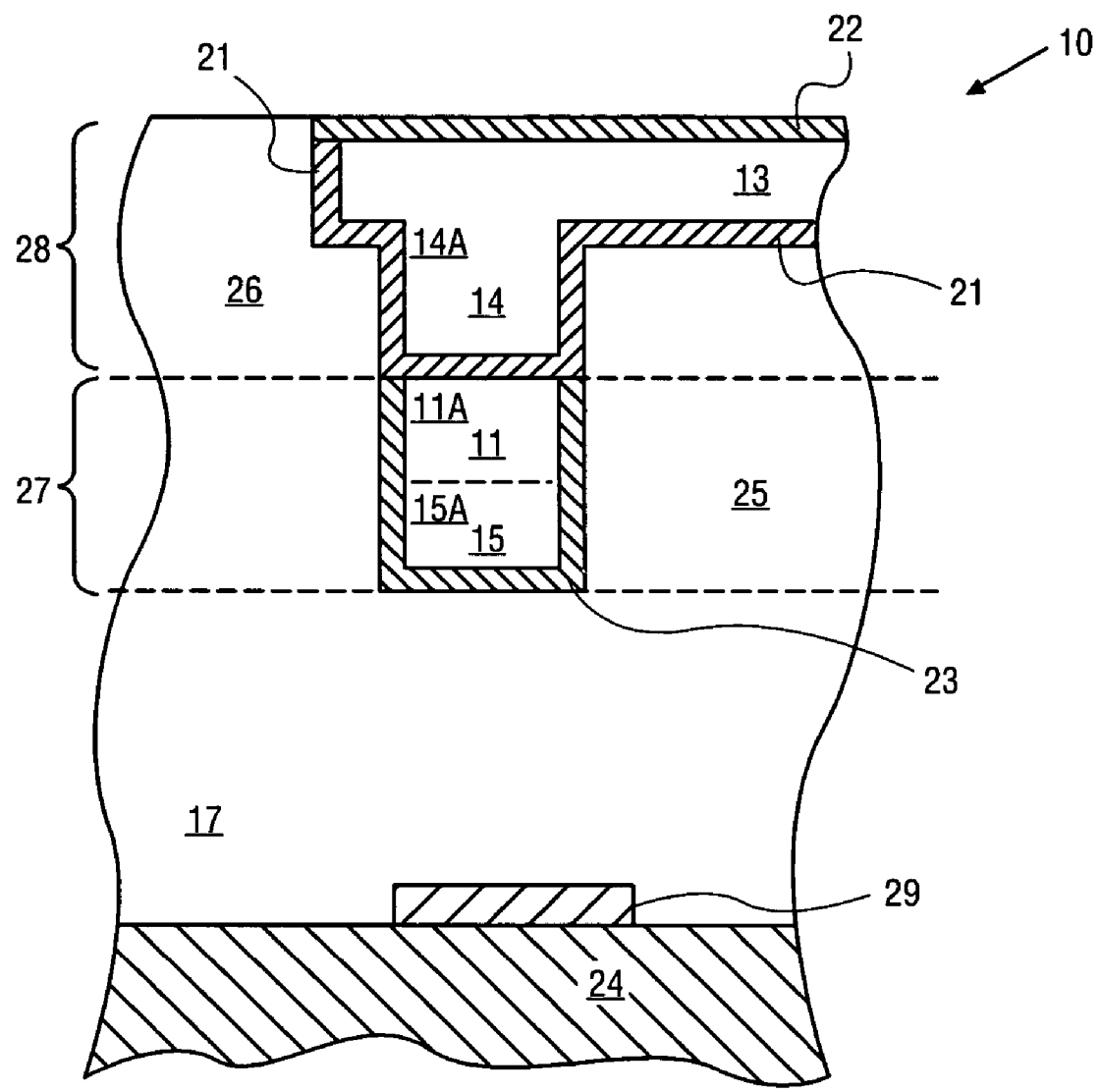
FIG. 3 is another cross-sectional view of IC interconnect structure of FIG. 1, according to one embodiment of the invention.
Figure 4:
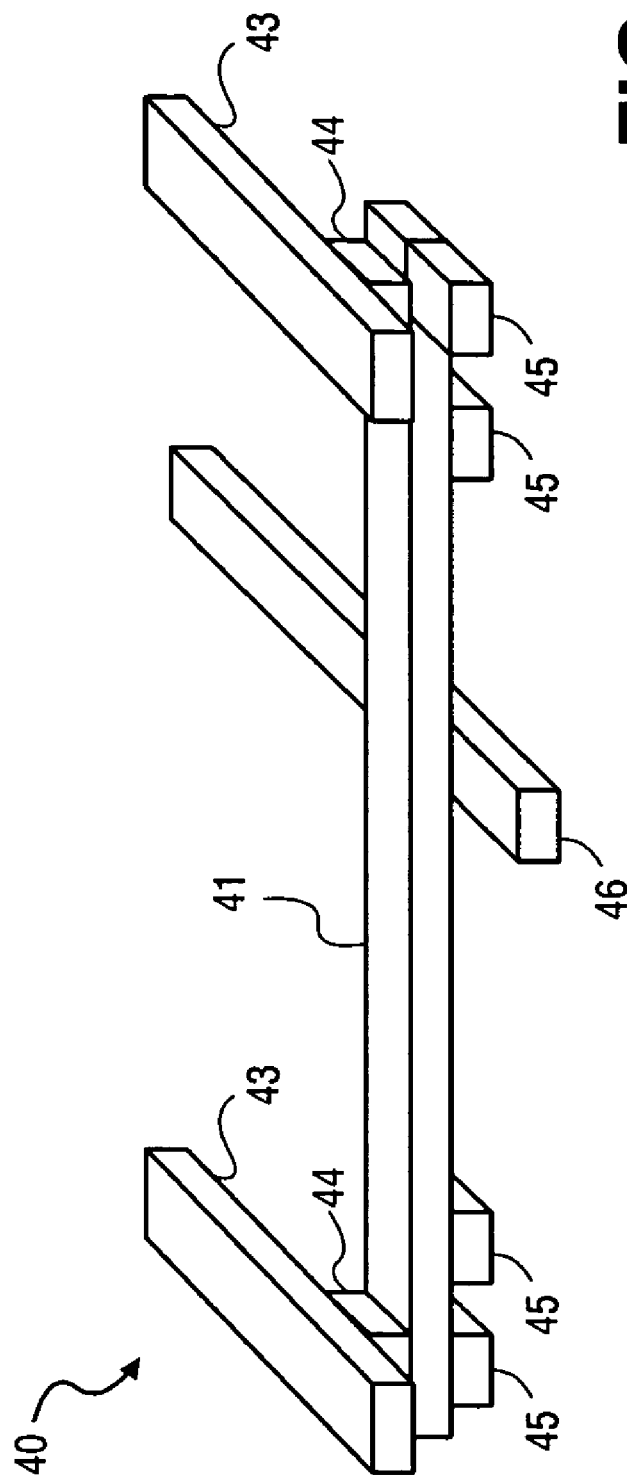
FIG. 4 is a 3-D schematic view of an IC interconnect structure having dummy via plugs which are electrically inactive according to another embodiment of the invention.
Figure 5:
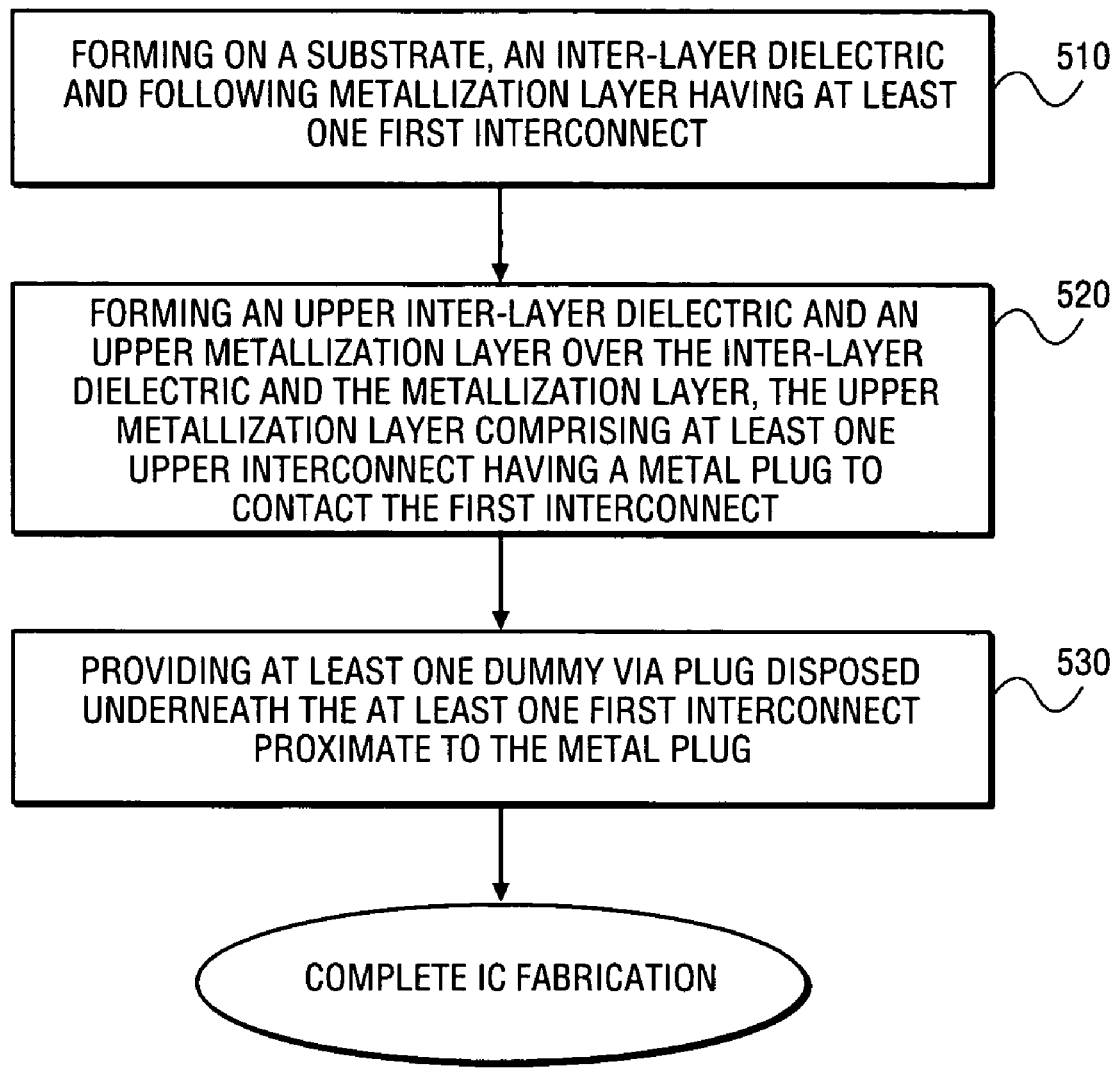
FIG. 5 is a process for improving the electromigration reliability of dual-damascene interconnects through the introduction of material reservoirs in the form of dummy via plugs according to one embodiment of the invention.

Referring now to the drawings, where like elements are designated by like reference numerals, embodiments of the present invention for improving the electromigration reliability of damascene interconnects through the introduction/addition of vertical material reservoirs in the form of passive or dummy via plugs are illustrated by FIGS. 1 through 5. FIGS. 1–4 are schematic views of various embodiments according to this invention of an integrated circuit metallic interconnect structure having dummy via plugs which are electrically inactive. FIG. 5 shows an embodiment of a process of this invention for improving the electromigration reliability of damascene interconnects through the addition of material reservoirs in the form of passive or dummy via plugs introduced in the vertical plane of metallic interconnect structures, (i.e., disposed perpendicular to the plane of the interconnects).

FIGS. 1–3 schematically illustrate an integrated circuit (IC) interconnect structure 10 that includes at least one conductor/interconnect having electrically inactive dummy via plugs according to an embodiment of this invention. The IC interconnect structure 10 may include at least one first conductor/interconnect 11. In one embodiment, interconnect 11 has longitudinal ends 12a, 12b near metal via plugs 14 as shown in FIG. 1. In another embodiment, interconnect 11 continues longitudinally beyond area 18, as shown by the edge treatment of 12a, 12b in FIG. 2. First conductor/interconnect 11 may be contacted to one or more second conductor(s)/interconnect(s) 13 through metal via plugs 14. First conductor/interconnect 11, second conductors/interconnect(s) 13 and metal via plugs 14 may be surrounded by non-conductive material (such as layer 17 in FIGS. 2 and 3) to hold the conductive elements in place and, where appropriate, insulate them from each other.

In copper (Cu)-based technologies, metal via plugs 14 are typically lined with a metal layer 21 (shown in FIG. 3) for example a refractory metal barrier layer 21 which does not electromigrate. Metal via plugs 14 and ends 12a, 12b of first interconnect 11 each create blocking boundaries for the atomic flux. Metal via plugs 14 and like contacts provide sites of flux divergence so that voids can generally nucleate and grow at metal via plugs 14.

To control electromigration, first conductor/interconnect 11 includes one or more metal reservoirs in the form of passive or dummy via plugs 15 disposed on or proximate to a section 18 of the first conductor/interconnect 11, where section 18 is a site of atomic flux divergence and thus a place where electromigration-induced stress typically occurs. Generally, section 18 of first conductor/interconnect 11 where passive or dummy via plugs 15 may be disposed or located on first interconnect 11 includes, but is not limited to, electrically active via plugs, such as metal via plugs 14, and first conductor/interconnect 11 structural and directional changes, for example bends, interruption, etc. in the structure of first interconnect 11. Furthermore, section 18 of first conductor/interconnect 11 where passive or dummy via plugs 15 may be disposed on first interconnect 11 may include any other feature in first conductor/interconnect 11 or the IC interconnect structure 10 where electromigration-induced mechanical stress typically occurs.

Continuing with reference to FIGS. 1–3, dummy via plugs 15 on first conductor/interconnect 11 may be disposed in a vertical direction 20 or vertical plane 20 with first conductor/interconnect 11, e.g. first metal connector/interconnect 11, within the inter-level dielectric 17. For example, dummy via plugs 15 may be disposed underneath first connector/interconnect 11. In the context of the invention, 'vertical' means in a direction perpendicular to the plane of the interconnect, and 'underneath' means in the direction that is first built up as layers of material are deposited during processing. In addition, to prevent short circuit with the underlying metal layer, dummy via plugs 15 are disposed/arranged such that they do not touch or contact other underlying metal layer(s), for example a third conductor 16, e.g. metal line 16.

In one embodiment (as shown in FIGS. 1–3), first connector/interconnect 11 includes a single dummy via plug 15 for each electrically active metal via plug 14 that provides a contact path between a first interconnect 11 and a second interconnect 13, such as an upper-metal-level second interconnect 13. Each dummy via plug 15 is disposed underneath first connector/interconnect 11, for example on a bottom surface 19 of first connector/interconnect 11, and proximate to electrically active metal via plug 14.

With reference to FIG. 4, in another embodiment of the invention, an IC interconnect structure 40 includes a first interconnect 41 having at least two dummy via plugs 45 for each electrically active metal via plug 44 that provides a contact path between the first interconnect 41 and a second interconnect 43, such as an upper-metal-level second interconnect 43. Dummy via plugs 45 are disposed underneath first interconnect 41 and proximate to electrically active metal via plugs 44. To prevent short circuit with the underlying metal layer, dummy via plugs 45 are disposed/arranged such that they do not touch or contact other underlying metal layer(s), for example third conductor 46, e.g. metal line 46.

FIG. 5 shows a flow chart of a process according to one embodiment of the invention. FIG. 5 is discussed with reference to FIGS. 1–3. The IC interconnect structure 10 having an interconnect 11 with dummy via plugs 15 disposed underneath is generally formed using a via-first damascene process. It is understood that the illustrated structure 10 represents only a portion of many structures present on an integrated circuit device. Structure 10 or similar may be fabricated utilizing single or dual damascene processes known in the art.

Generally, a via-first damascene process involves forming an opening such as a trench and/or via in a dielectric material layer to an underlying circuit device, such as a transistor or an interconnection line disposed on a substrate. The via and/or trench are then lined with a barrier/adhesion layer based on a refractory metal. The barrier layer typically serves to inhibit the diffusion of the interconnection material that will subsequently be formed in the via into the dielectric. Next, a suitable seed material is deposited on the wall or walls and base of the via. Suitable seed materials for the deposition of copper interconnection material include copper and nickel. Following seed material deposition, the wafer may be annealed in an atmosphere containing argon or nitrogen. Next, interconnection material, such as copper or copper alloy, is deposited in a sufficient amount to fill the via and trench using, for example, an electroplating process or an electroless process. Following the deposition of the interconnection material, a chemical-mechanical polishing or etching process is used to remove any interconnection material present outside the trench. A passivation layer, for example a silicon nitride layer, is formed overlying the interconnect level. The purpose of the passivation layer is to reduce the likelihood of metal atoms within the interconnect level from diffusing into the dielectric film that is subsequently deposited over the interconnect level. If a trench and an underlying via are filled simultaneously with the interconnection metal, the process is known as a dual damascene process.

Continuing with reference to FIGS. 1–3 and 5, in one embodiment of this invention, the method includes forming an inter-layer dielectric 25 and following metallization layer 27 on a substrate 24 (block 510 of FIG. 5). The metallization layer 27 may include at least one first interconnect 11. The surface of substrate 24 may include a transistor/metal line 29, or alternatively it may be bare.

The method further includes forming an upper inter-layer dielectric layer 26 and an upper metallization layer 28 over the inter-layer dielectric 25 and the metallization layer 27. The upper metallization layer 28 includes at least one upper interconnect 13 that has a metal plug 14 disposed between metallization layer 27 and upper metallization layer 28 to provide electrical contact between first interconnect 11 and upper interconnect 13 (block 520 of FIG. 5).

The method continues by providing at least one dummy via plug 15 disposed underneath the first interconnect 11 and proximate to the metal plug 14. To prevent short circuit with any other underlying metal layers, dummy via plugs 15 are disposed/arranged such that they do not touch or contact other underlying metal layer(s).

Metallization layers 27, 28 are representative of metal layers in a multiple metal level semiconductor device. Inter-layer dielectric 25 and upper inter-layer dielectric layer 26 may be used to separate the different metal layers. In one embodiment, ILD layers 25, 26, which may be made of a material such as borophosphosilicate glass (BPSG), phosphosilicate glass (PSG), borosilicate glass (BSG), silicon dioxide, fluorine doped silicon oxide, low dielectric constant (low-k) dielectric material, or spin-on dielectric material may be formed over substrate 24 by chemical vapor deposition (CVD), physical vapor deposition (PVD) or other suitable means.

Forming metallization layer 27 typically includes providing substrate 24 into a semiconductor device processing tool to form an inter-layer dielectric 25 on substrate 24. The semiconductor device-processing tool generally includes several chambers where substrate processing is performed without breaking vacuum conditions. The inter-layer dielectric layer 25 is patterned using well known lithography techniques to form openings, such as trenches and vias 11a, and dummy via trenches 15a, therein.

Next, a barrier layer 23 is generally formed over the ILD layer 25 and in the trench/via opening(s) 11a, 15a so that the barrier layer 23 overlies the ILD layer 25 and lines the inside of the trench/via opening(s) 11a, 15a. Barrier layers, such as barrier layer 23, are typically used with metal interconnect material to optimize performance of the interconnects and to prevent diffusion of the metal interconnect material into the substrate. Barrier layer 23 may be formed of tantalum (Ta), tantalum nitride (TaN), titanium (Ti), titanium nitride (TiN), tungsten nitride (WN), tungsten-tantalum (WTa), tantalum silicon nitride, or other ternary compounds. However, it is appreciated that other materials can be used for barrier layer 23 in the practice of the present invention. The barrier layer 23 may be formed using known film deposition techniques, such as CVD, PVD, electrolytic plating or electroless plating. In some embodiments, barrier layer 23 is deposited to a thickness in the range of approximately 150–300 angstroms (Å), and in a particular embodiment about 200 Å. However, other barrier thickness may be practiced within the scope of this invention.

The process may continue by forming a metal seed layer (not shown), such as a copper-seed layer, over the barrier layer 23 that overlies the ILD layer 25 and lines the inside of the trench/via openings 11a, 15a. The metal seed layer may be deposited or formed by employing a directional deposition technique and using metals, metal alloys, metal compounds, multiple layers of metal stack or any substrates where a metal that is to be used to form the interconnects in the trench and the via can nucleate and grow. The metal seed layer may be made of a metal or metal alloy and may include, but is not limited to, copper, copper alloy, nickel, silver, gold, and cobalt. In various embodiments, the seed layer may be deposited to a thickness in the range of approximately 1000–3000 angstroms (Å), and in a particular embodiment about 2000 Å.

Prior to electrolytic/electroless plating of conductive material on substrate, the metal seed layer may be physically or chemically treated in-situ or ex-situ using a liquid or a chemically active or inert gas. For example, in one embodiment, the metal seed layer surface may be exposed to gases, such as argon (Ar), Helium (He), Oxygen ($O_2$), Hydrogen ($H_2$), $H_2$ and He, $H_2$ and nitrogen ($N_2$), $H_2$ and Ar, etc. at a range of temperatures and concentrations known in the art. In another embodiment, the metal seed layer surface may be exposed to liquid media such as acids, bases, solvents, and di-ionized water prior to electrolytic/electroless plating of the conductive material in trenches/vias 11a, 15a formed in the inter-layer dielectric 25.

Following in situ (or ex situ) seed surface passivation (or seed treatment) of the metal seed layer, for example in situ surface passivation of Cu-based seed layer in the Cu barrier-seed deposition tool, the integrated circuit interconnect structure 10 may be annealed in a forming gas to eliminate or reduce any contaminants on the substrate.

Next, the IC fabrication process may continue by performing electroless or electrolytic plating of substrate structure 10 to deposit a conductive material, e.g. metal or alloy, into trenches and/or vias 11a, 15a of structure 10. The deposited conductive material may form a metal first interconnect 11 having dummy metal vias 15. Electroless and electrolytic plating processes that may be used to form metal interconnect 11 and dummy metal via 15 are known in the art.

The plating may be done with a solution of copper sulfate (resulting in a copper plating), silver nitrate (resulting in a silver plating) or gold cyanide (resulting in a gold plating). By way of example, in a copper electroplating process, metallic ions in a pH neutral copper-based solution, such as a copper sulfate-based solution, may be reduced to a metallic state by applying current between the seed material layer and an anode of an electroplating cell in the presence of the solution. Copper metal becomes deposited onto the seed material layer to fill the trench/via, for example vias 11a, 15a and form copper interconnection line 11 having dummy metal vias 15.

By way of example, in an electroless copper plating process, the IC substrate structure/wafer 10 is exposed to a first plating solution by means such as immersion of the substrate structure/wafer 10 into a plating bath, or by spraying the plating solution onto the structure/wafer 10. The first plating solution is an aqueous solution of an acid such as hydrofluoric acid or sulfuric acid, and a metal salt or complex that is soluble in the acid used. A redox reaction occurs between the metal ions in the solution, e.g., cupric ions ($Cu^{2+}$) and a reducing agent leading to reduction of the metal ions and subsequent plating onto the copper seed layer. The reaction typically proceeds at room temperature for a period of time until the conductive interconnect/level is formed. Time and temperature may be adjusted as necessary to affect the rate of the reaction, as is known in the art.

Following electroless or electrolytic plating of substrate structure 10, a chemical-mechanical polishing (CMP) process or a chemical etch removal process may be performed. CMP or chemical etch removal polishes away or removes the excess copper material and the barrier layer 23 above the ILD layer 25, so that the only copper and barrier layer material left will be in trenches/vias 11a, 15a. Following CMP or chemical etch process, a passivation layer, for example a silicon nitride layer is formed over interconnect 11 and ILD layer 25 prior to depositing the next ILD layer, for example ILD layer 26 over the substrate.

Continuing with reference to FIG. 3, a metallization layer 28 having upper interconnects 13 contacted to first interconnect 11 through metal via plugs 14 is next formed using the steps presented above for forming first interconnect 11: (1) forming an opening such as a trench and/or via 14a in a dielectric material layer 26; (2) lining via/trench 14a with a barrier/adhesion layer 21 of a refractory material; (3) forming a seed layer (not shown) on the wall or walls and base of the via 14a; (4) annealing the structure 10 in an atmosphere containing argon or nitrogen; (5) depositing interconnection material, such as copper or copper alloy, in a sufficient amount to fill the via/trench 14a using, for example, an electroplating process or an electroless process; (6) performing CMP or etching process to remove any interconnection material present outside the trench; (7) forming a passivation layer 22, for example a silicon nitride layer, overlying the interconnect level.

The apparatus and method of this invention have significant advantages over current metallic interconnect structures. Unlike conventional reservoirs which are introduced in-plane in the interconnect through enlargement of via enclosures or via coverages, introducing or adding dummy via plugs in the vertical direction in the interconnect structure is performed without any IC area penalties. Furthermore, introducing or adding material reservoirs/dummy via plugs in the vertical direction in the interconnect structure comes without additional costs since it can be done using existing mask designs/configurations and existing IC manufacture processes.

The invention may be implemented in one or a combination of hardware, firmware, and software. The invention may also be implemented as instructions stored on a machine-readable medium, which may be read and executed by at least one processor to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, etc.), and others.

In one embodiment, a machine-readable medium may include instructions which, when executed by at least one processor, perform the following in an integrated circuit processing system: 1) forming a dummy via plug; 2) forming a first interconnect electrically connected to the dummy via plug at a particular location, where the dummy via plug is disposed from the interconnect in a direction perpendicular to the plane of the interconnect; 3) forming a second via plug electrically connected to the first interconnect near the particular location; and 4) forming a second interconnect electrically connected to the first interconnect through the second via plug. In one embodiment, the resulting structure resembles the structure shown an area 18 for FIGS. 1, 2.

The foregoing description is intended to be illustrative and not limiting. Variations will occur to those of skill in the art. Those variations are intended to be included in the invention, which is limited only by the spirit and scope of the appended claims.

I claim:

1. A method comprising:

forming an inter-layer dielectric and following metallization layer formed of a metal selected from the group consisting of copper, silver, and gold on a substrate, the metallization layer comprising a first interconnect;

forming an upper inter-layer dielectric and an upper metallization layer formed of a metal selected from the group consisting of copper, silver, and gold over the inter-layer dielectric and the metallization layer, the upper metallization layer comprising an upper interconnect having a metal plug to contact the first interconnect; and providing a dummy via plug disposed underneath and in contact with the first interconnect and underneath the metal plug at a location site of atomic flux divergence caused by electromigration to provide a reservoir for metal ions to reduce a build-up of electromigration-induced mechanical stress.

2. The method of claim 1 wherein the dummy via plug is not in electrical contact with other underlying interconnects within an integrated circuit.

3. The method of claim 1 further comprising forming a second dummy via plug underneath the at least one first interconnect and proximate to the metal plug.

* * * * *